United States Patent [19]

Verkuil et al.

[11] Patent Number: 5,498,974
[45] Date of Patent: Mar. 12, 1996

[54] CONTACTLESS CORONA-OXIDE-SEMICONDUCTOR Q-V MOBILE CHARGE MEASUREMENT METHOD AND APPARATUS

[75] Inventors: Roger L. Verkuil, Wappingers Falls; Min-Su Fung, LaGrangeville, both of N.Y.

[73] Assignee: International Business Machines Corporation, Armonk, N.Y.

[21] Appl. No.: 366,861

[22] Filed: Dec. 30, 1994

[51] Int. Cl.[6] ............................ G01R 31/26; G01R 31/28
[52] U.S. Cl. ....................... 324/767; 250/492.2; 324/750; 324/765
[58] Field of Search ................................. 324/500, 501, 324/750, 765, 766, 767; 250/492.2

[56] References Cited

U.S. PATENT DOCUMENTS

| | | | |
|---|---|---|---|
| 3,796,955 | 3/1974 | Bhattacharyya et al. | 324/158 T |
| 4,168,432 | 9/1979 | Williams et al. | 250/370 |
| 4,326,165 | 4/1982 | Szedon | 324/158 R |
| 4,599,558 | 7/1986 | Castellano et al. | 324/765 |
| 4,712,057 | 12/1987 | Pau | 324/158.1 |
| 4,812,756 | 3/1989 | Curtis et al. | 324/158 R |
| 4,978,915 | 12/1990 | Andrews, Jr. et al. | 324/158 R |
| 5,042,952 | 8/1991 | Opsal et al. | 356/432 |
| 5,216,362 | 6/1993 | Verkuil | 324/158 D |

FOREIGN PATENT DOCUMENTS

| | | |
|---|---|---|
| 5512408 | 1/1980 | Japan . |
| 1068847 | 1/1984 | U.S.S.R. . |
| 1345823 | 7/1991 | U.S.S.R. . |

OTHER PUBLICATIONS

Curtis, H. W. et al., "Contactless Electrical Equivalent Oxide Thickness Measurement", IBM Tech. Disc. Bulletin, vol. 29, No. 10, Mar. 1987, pp. 4622–4623.
R. L. Verkuil, "Contactless Alternatives to MOS Charge Measurements" Electrochemical Society, V. 80–2, Abstract #525, Oct. 1980, pp. 1312–1315.
R. L. Verkuil, et al., "A Contactless Alternative to MOS Charge Measurements by Means of a Corona–Oxide–Semiconductor (COS) Technique" Electrochemical Society, V. 88–1, Abstract #169, May 1988, pp. 261–262.
P. Edelman, "New Approach to Measuring Oxide Charge and Mobile Ion Concentraction" Proceedings Reprint, SPIE–International Soc. for Optical Engineering, Reprinted from Optical Characterization Techniques For High–Performance Microelectronic Device Manufacturing, V. 2337, Austin, Tex., Oct. 1994, pp. 154–164.

Primary Examiner—Ernest F. Karlsen
Attorney, Agent, or Firm—Susan M. Murray; Michael J. Balconi-Lamica

[57] ABSTRACT

A method and apparatus comprises heating a wafer to a temperature sufficient to temperature stress the wafer and enable ion motion. The wafer is then initialized in a measurement region with a non-contact corona discharge of a first polarity until a first dielectric field is developed, wherein any mobile ions present in the dielectric layer or at an air/dielectric interface move to a substrate/dielectric interface. A non-contact pulsed corona discharge of a second polarity, opposite the first polarity, is then applied to the wafer until a second dielectric field is developed and an amount of corona discharge $Q_{MEASURED}$ necessary to change the dielectric field from the first dielectric field to the second dielectric field is measured, wherein any mobile ions present at the dielectric/substrate interface move to the air/dielectric interface. An ideal amount of corona discharge $Q_{IDEAL}$, in the absence of any highly mobile ionic species, necessary to change the dielectric field voltage of a dielectric layer of known thickness from a third dielectric field to a fourth dielectric field is then established. Lastly, measured corona discharge $Q_{MEASURED}$ is compared to ideal corona discharge $Q_{IDEAL}$, wherein a quantitative difference between $Q_{MEASURED}$ and $Q_{IDEAL}$ is indicative of the amount of mobile charge $Q_{MOBILE}$, $Q_{MOBILE}$ being representative of the amount of mobile ionic species in the dielectric layer.

12 Claims, 7 Drawing Sheets

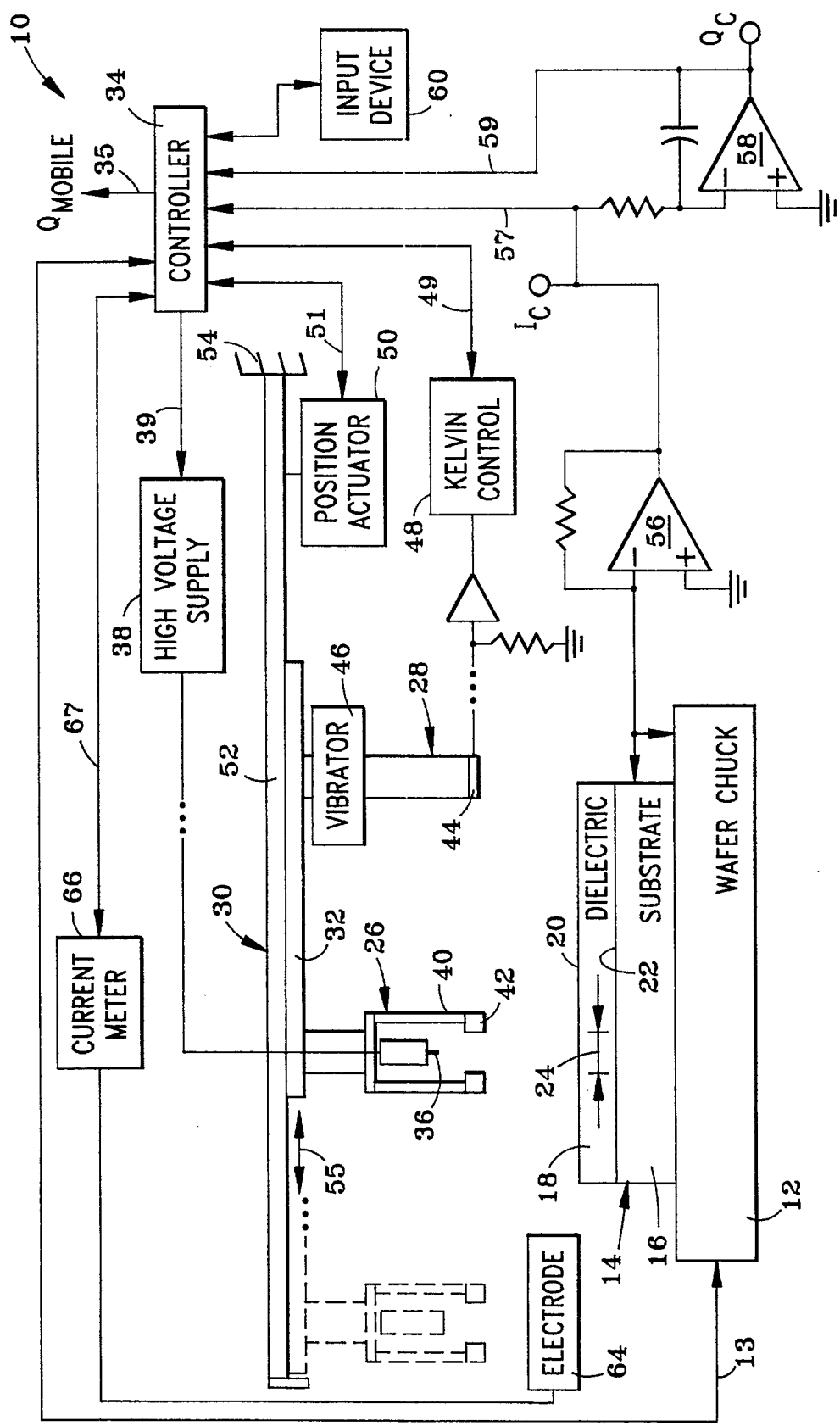

CONTACTLESS CORONA-OXIDE-SEMICONDUCTOR Q-V MOBILE CHARGE MEASUREMENT METHOD AND APPARATUS

BACKGROUND OF THE INVENTION

1. Field of the Invention

The present invention generally relates to the field of semiconductor wafer testing, and more particularly, to a non-contact method and apparatus for testing such wafers.

2. Discussion of the Related Art

There are a variety of important measurements that must be made on a semiconductor wafer to determine whether it is suitable for further device processing and to make process adjustments. Examples of such measurements include doping concentration measurements, charge time retention measurements, and general leakage measurements. However, present measurement techniques have repeatability problems, and those techniques that utilize metal-oxide-semiconductor (MOS) structures to make the measurements destroy the wafer under test.

One such measurement that must be made on a semiconductor wafer to determine whether it is suitable for further device processing is the monitoring of mobile ion contamination. Monitoring of mobile ion contamination, such as sodium or potassium, is very important for improved yield and reliability of field effect transistor (FET) products. Mobile ion contamination adversely affects the performance of an FET, in that, an amount of gate voltage needed to turn the FET device "ON" is modified by the presence of mobile ions in the gate oxide. Presently known techniques for monitoring mobile ion contamination include MOS current-voltage (I-V) loop and MOS pulsed charge-voltage (Q-V) measurements. With these techniques, they are especially sensitive to mobile ions, via the detection of ionic current transients during bias-temperature stressing. However, a disadvantage of these techniques is that they require the use of MOS structures. Using a MOS structure to detect ionic currents is expensive and time consuming, in terms of the sample preparation for MOS electrodes (i.e., aluminum dots) and the recycling of monitor wafers. Furthermore, MOS dot sample preparation increases the likelihood for introducing mobile ion contamination. Still further, mobile ions tend to get trapped at the aluminum dot/oxide interface. As a result, the trapped mobile ions may not completely de-trap and be fully detected during modest bias-temperature stressing.

In further discussion regarding mobile ionic charge, mobile ions are most commonly caused by impurity atoms, e.g. of sodium. Sources of sodium can be on quartz ware in oxide furnaces. Sodium may also be found in chemicals, such as, photoresists, being used during a semiconductor manufacturing process. For instance, if a photoresist is not totally removed during device fabrication, some sodium may remain and/or sodium may diffuse into an underlying oxide. Such may be the case when using a plasma stripping process to oxidize a photoresist. In this later case, the wafer would be subjected to an elevated temperature and further be subjected to an electric field, wherein sodium ions would tend to diffuse into the underlying oxide.

In U.S. Pat. No. 4,978,915, a method of manufacturing semiconductor devices involving the detection of impurities is disclosed. The method of the '915 patent increments a voltage on an MOS electrode and monitors a corresponding increment in charge, as measured by a coulombmeter. A voltage on the dielectric is forced using a probe contact. The resultant charge increments are measured via a probe contact to the coulombmeter. Such a method suffers from the above discussed disadvantages with respect to the use of MOS electrodes.

There is thus needed an alternative improved method and apparatus for obtaining "MOS-like" measurements. Such an apparatus, and method, should be well suited for providing desired "MOS-like" measurements and further having acceptable repeatability and accuracy of measurements suitable for advanced semiconductor monitoring needs.

SUMMARY OF THE INVENTION

An object of the present invention is to provide a non-contact Q-V mobile charge measurement apparatus and method.

Another object of the present invention is to provide a non-contact Q-V mobile charge measurement apparatus, and method, which avoids the use of MOS dot structures while advantageously offering a desirable mobile charge measurement feature of directly examining mobile ion current transients during bias-temperature stressing.

According to the invention, a contactless corona-oxide-semiconductor Q-V mobile charge measurement method and apparatus detect a presence of mobile ions in oxides via detection of ionic current transients during a bias-temperature stressing. An appropriate electric field to make mobile ions move during bias-temperature stressing is created by charging up an oxide surface with a well controlled corona discharge source. Resultant ionic current is then monitored via a time rate of decay of the corona induced oxide voltage. A non-contact measure of the corona induced oxide voltage is then provided by an electrostatic voltmeter or vibrating Kelvin probe.

More particularly, in further accordance with the present invention, a contactless corona-oxide-semiconductor mobile ionic charge measurement method and apparatus for measuring an amount of mobile ionic species in a dielectric layer of a semiconductor wafer comprises heating the wafer to a temperature sufficient to temperature stress the wafer and enable an ion motion. A measurement region of the wafer is initialized with a non-contact corona discharge of a first polarity until an initial surface voltage potential $E_0$ is obtained on the dielectric layer, whereby any mobile ions present in the dielectric or at an air/dielectric interface are caused to move to a dielectric/substrate interface. A non-contact pulsed corona discharge of a second polarity, opposite from the first polarity, is then applied to the wafer at the top surface of the dielectric layer in the measurement region until the surface voltage potential in the measurement region is reduced from $E_0$ to a first surface voltage potential $E_1$. The non-contact pulsed corona discharge of the second polarity is thereafter continued to the wafer at the top surface of the dielectric layer in the measurement region until the surface voltage potential in the measurement region is further reduced from $E_1$ to a second surface voltage potential $E_2$, whereby any mobile ions present at the dielectric/substrate interface are caused to move to the air/dielectric interface. A cumulative amount of corona charge deposited on the surface of the dielectric during the reduction of the surface voltage potential from $E_1$ to $E_2$ is monitored. The cumulative monitored charge corresponds to a measured amount of corona charge $Q_{MEASURED}$ necessary to change a dielectric field of the dielectric layer by a desired amount corresponding to the change in surface voltage potential from $E_1$ to $E_2$ in the presence of any mobile ions. An ideal amount of charge $Q_{IDEAL}$ corresponding to an amount of charge necessary to change a dielectric field of the dielectric layer, in an absence of any mobile ions, from a third dielectric field corresponding to the second surface voltage potential $E_2$ to a fourth dielectric field corresponding to the first surface voltage potential $E_1$ is then established. Thereafter, the measured amount of corona charge $Q_{MEASURED}$ is compared to the ideal amount of corona charge $Q_{IDEAL}$ wherein a quantitative difference between $Q_{MEASURED}$ and $Q_{IDEAL}$ is indicative of an amount of mobile charge $Q_{MOBILE}$. $Q_{MOBILE}$ is representative of the amount of mobile ionic species in the dielectric layer.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, in which:

FIG. 1 is a schematic diagram illustrating the measurement apparatus according to the present invention, with some portions in section;

DETAILED DESCRIPTION OF THE PREFERRED EMBODIMENTS

Figure 2A:
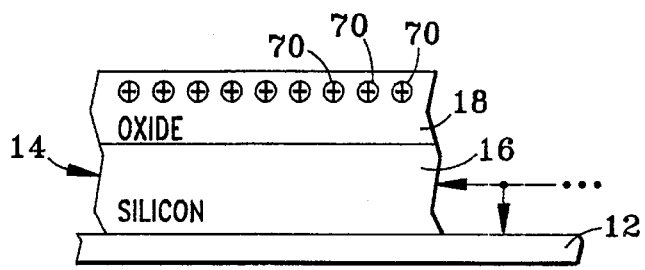
FIG. 2 (a, b, c, d, and e) are schematic diagrams of a cross-section of an oxide-semiconductor structure after corresponding steps of the method according to the present invention.

Referring now to the Figures, and more particularly to FIG. 1, a contactless corona-oxide-semiconductor mobile ionic charge measurement apparatus, generally referred to by numeral 10, is shown. Mobile ionic charge measurement apparatus 10 comprises, in part, a temperature controllable wafer chuck means 12 for heating a semiconductor wafer 14 to be tested, as will be discussed further below. Wafer 14 comprises a semiconductor substrate 16 having a dielectric layer 18 disposed thereon, wherein dielectric layer 18 comprises an oxide layer. For the purpose of discussion, the thickness of oxide layer 18 is on the order of 1600 Angstroms (Å); however, oxide layer 18 can be of other thicknesses. Wafer 14 is further characterized by an air/dielectric interface 20 and a dielectric/substrate interface 22. Air/dielectric interface 20 further corresponds to a top surface of dielectric layer 18. A measurement region 24, as shown in FIG. 1, depicts a region of the dielectric layer 18 which is selected as appropriate for testing with apparatus 10.

Referring still to FIG. 1, apparatus 10 further comprises a calibrated corona discharge source or gun 26 for depositing corona charge on the surface 20 of the dielectric layer 18. An electrostatic measurement means 28 enables a surface voltage potential of wafer 14 to be measured. A high speed linear translational positioning means 30 provides a desired positioning of the corona discharge gun 26 and electrostatic measurement means 28 above the dielectric layer 18 of wafer 14. Corona discharge gun 26 and electrostatic measurement means 28 are suitably attached to a movable carriage 32 of translational positioning means 30. Apparatus 10 further comprises a control means or controller 34 for device operability, as will be further explained herein below.

In further discussion of wafer chuck means 12, wafer chuck means 12 comprises any suitable temperature controllable wafer chuck, such as is commercially available from Temptronic Corporation of Newton, MA. Such a wafer chuck means preferably has good electrical isolation between the chuck heating element and the top surface of the chuck to minimize any introduction of noise into measurements performed during a testing operation of apparatus 10. Wafer chuck means 12 is connected to controller 34 via signal line 13 for suitable control thereof, i.e., for maintaining a desired constant temperature upon the chuck surface for heating the wafer 14. Alternatively, wafer chuck means 12 may include an independent temperature control unit (not shown) for maintaining a desired constant temperature upon the chuck surface. Wafer 14 is also ohmically connected to the surface of the wafer chuck 12 by suitable means, such as with a tungsten carbide needle.

Corona discharge source or gun 26 comprises a non-contact corona charge depositing structure including a corona discharge needle 36 which is connected to a charge biasing means 38. Corona gun 26 further includes an electrode housing 40, which in conjunction with needle 36, provides a focusing of the corona discharge. To ensure charge uniformity, needle 36 is disposed a distance above the surface of the dielectric layer 18 to ensure that fringing effects and other causes of charge deposition non-uniformity are minimized. Typically, such a distance is on the order of several centimeters above surface 20. In addition, an aperture mask 42, having an aperture diameter on the order of two centimeters, is attached to housing 40. Aperture mask 42 is disposed over the surface of the dielectric layer 18 with a spacing on the order of 10 mils to provide good charging definition and uniformity. Charge biasing means 38 comprises a high voltage power supply for outputing a desired voltage output, such as, in a range of plus 8 K*volts to minus 8 K*volts. Charge biasing means 38 is further suitably connected to controller 26 via an appropriate signal line 39, for a desired feedback control of charge biasing means 38 during an operation of apparatus 10, as will be explained further herein below.

Electrostatic measurement means 28 comprises a non-contact means for measuring the voltage changes between the top surface 20 of the dielectric layer 18 and the bulk silicon substrate 16 of the semiconductor wafer 14. As shown in FIG. 1, electrostatic measurement means 28 comprises a Kelvin probe apparatus. Kelvin probe apparatus are well known in the art and only briefly discussed herein. For instance, a typical Kelvin probe apparatus comprises a capacitive pick-up plate 44 connected to a vibrating apparatus 46. Pick-up plate 44 has a diameter on the order of 0.6 cm. Electrostatic measurement means 28 is suitably positioned above the top surface 20 of dielectric layer 18 by translational positioning means 30, such that, pick-up plate 44 is capacitively coupled to the wafer 14 across an approximate 5 mil air gap. The vibration of the pick-up plate 44 relative to the wafer surface 20 induces a time varying charge on the surface of the pick-up plate 44, at the vibration frequency of the vibrating apparatus 46. The resultant time varying current at the vibration frequency is proportional to the potential difference between the pick-up plate 44 and the dielectric surface 20. The time varying charge on the pick-up plate 44 is coupled to a high input impedance MOSFET and subsequently to a Kelvin control unit 48, resulting in a voltage $V_S$ which approximates the surface voltage potential on the dielectric surface 20, relative to the underlying substrate 16 of semiconductor wafer 14. A signal line 49 connects controller 26 with the Kelvin control unit, as appropriate, for control of the Kelvin control unit and for the obtaining of surface voltage potential information during an operation of apparatus 10. While electrostatic measurement means 28 has been described as comprising a Kelvin probe apparatus, means 28 may likewise comprise any suitable non-contact electrostatic voltmeter, such as, available from Trek Corporation of Medina, NY.

As indicated above, high speed linear translational positioning means 30 provides a desired positioning of the corona discharge gun 26 and electrostatic measurement means 28 above the dielectric layer 18 of wafer 14. Translational positioning means 30 includes movable carriage 32 and further includes a position actuator or control unit 50 for controlled translational movement of the carriage to a desired position or positions along a racing or track 52 of positioning means 30. Positioning means 30 may comprise any suitable controllable positioning means or translational stage. Position actuator 50 and track 52 may comprise for example a suitable stepper motor and worm gear, respectively. Alternatively, position actuator 50 and track 52 may likewise comprise a suitable arrangement of pneumatic actuators and guide rails. Positioning means 30 is further suitably attached to a mechanical ground 54.

Corona discharge gun 26 and electrostatic measurement means 28 are suitably attached to carriage 32 by a suitable spaced amount as shown in FIG. 1. During an operation of apparatus 10, corona discharge gun 26 and the pick-up plate 44 of electrostatic measurement means 28 are alternatively positioned above the measurement region 24 of the dielectric layer 18, the direction of such positioning as indicated by arrow 55. That is, during a corona discharge step, corona discharge gun 26 is positioned above the measurement region 24 (such as shown in FIG. 1). During a surface voltage potential measurement, electrostatic measurement means 28 is positioned above, and approximately centered with respect to, the measurement region 24, such as, by an appropriate translational movement of carriage 32 by a distance equal to the spacing between the corona discharge gun 26 and pick-up plate 44 of electrostatic measurement means 28. Such desired translational positioning is effectively carried out by an appropriate controlled translational positioning of carriage 32 of means 30.

Upon exposure of the dielectric layer 18 to a corona discharge from corona gun 26, a corona current $I_C$ from the corona gun flows into the wafer 14 and then into the chuck 12. This current is converted to a voltage by operational amplifier 56 and then integrated by operational amplifier 58 to generate a voltage proportional to the coulombs of corona charge $Q_C$ deposited on the dielectric surface 20 of the wafer 14 under test. The current $I_C$ is fed back to the controller 34 via signal line 57, which in turn, provides appropriate control of high voltage power supply 38 and thus the voltage to corona discharge needle 36, in order to form a constant corona current servo. In addition, the output of integrating amplifier 58 is connected to controller 34 via signal line 59 for providing deposited corona charge $Q_C$ information to controller 34 for use during an operation of apparatus 10.

Controller 34 provides a means for controlling wafer chuck 12, corona gun 26, electrostatic measurement means 28, and translational positioning means 30 in a controlled manner, as will be discussed below. Controller 34 may comprise for example, a computer and associated interface circuitry, a suitable programmable control device, or the like, for providing desired control, data acquisition, and data manipulation functions. Preferably, controller 34 comprises a computer and associated interface circuitry, computers and associated interface circuitry being well known in the art and only briefly discussed herein, the computer further being programmed by known techniques for performing desired functions as described herein below. During a testing operation, controller 34 generates a measurement of an amount of mobile ionic species in a dielectric layer of a wafer under test. To this end, controller 34 may provide an output signal $Q_{MOBILE}$ on signal line 35, wherein $Q_{MOBILE}$ is representative of the amount of mobile ionic species in a dielectric layer of a wafer under test. Controller 34 may also include a display device (not shown) for presenting an analogous indication of an amount of mobile ionic species in the dielectric layer of the wafer under test, such as, by a suitable plot or graph. In addition, an input device 60, such as a keyboard, is connected to controller 34 for inputting information as necessary for a particular testing operation.

Prior to discussing controller 34 in further detail, a calibration means 62 is provided for calibrating a corona density of a corona charge deposited by corona gun 26. Calibration means 62 comprises a electrode 64 of known dimension, such as, having a top surface of a diameter on the order of one centimeter. Furthermore, the top surface of electrode 64 is positioned in a substantially similar plane as the top surface 20 of the dielectric layer 18. Calibration means 62 further includes a suitable current meter 66, connected to electrode 64. A signal line 67 connects controller 34 with the current meter 66, as appropriate, for control of the current meter 66 and for the obtaining of corona current information during a calibration of the corona gun 26, and further during an operation of apparatus 10. During a calibration of corona gun 26, corona gun 26 is suitably positioned above electrode 64 via translational positioning means 30.

In continuation of the above discussion of controller 34, referring still to FIG. 1, controller 34 provides appropriate control signals for controlling apparatus 10 during an operation thereof. More particularly, controller 34 controls the corona discharge gun 26 and the translational positioning means 30, and further in partial response to current $I_C$ and charge $Q_C$ signals, for: (i) establishing an initial surface voltage potential $E_0$ in the measurement region 24 of the dielectric layer 18, whereby any mobile ions present in the dielectric or at the air/dielectric interface 20 are caused to move or drift to the dielectric/substrate interface 22, (ii) reducing the initial surface voltage potential $E_0$ to establish a first surface voltage potential $E_1$, (iii) continuing to reduce the surface voltage potential, from $E_1$ to a second surface voltage potential $E_2$, and monitoring a cumulative corona charge deposited on the surface 20 of the dielectric layer 18 during the reduction of the surface voltage potential from $E_1$ to $E_2$, wherein the cumulative monitored charge corresponds to a measured amount of corona charge $Q_{MEASURED}$ necessary to change a dielectric field of the dielectric layer by a desired amount corresponding to the change in surface voltage potential from $E_1$ to $E_2$ in the presence of any mobile ions, whereby any mobile ions present at the dielectric/substrate interface 22 are caused to move or drift to the air/dielectric interface 20, (v) establishing an ideal charge $Q_{IDEAL}$ corresponding to an amount of charge necessary to change a dielectric field of the dielectric layer, in an absence of any mobile ions, from a third dielectric field corresponding to the second surface voltage potential $E_2$ to a fourth dielectric field corresponding to the first surface voltage potential $E_1$, and (vi) providing a mobile charge output signal indicative of an amount of mobile ionic charge $Q_{MOBILE}$ as a function of $Q_{MEASURED}$ and $Q_{IDEAL}$, $Q_{MOBILE}$ further being representative of the amount of mobile ionic species in the dielectric layer. Controller 34 further controls the corona discharge gun 26 and the translational positioning means 30, and further in partial response to an output signal from current meter 66, for controlling the corona discharge gun 26 and the translationally positioning means 30 for depositing corona upon the calibration electrode 64 and monitoring a current output from the current meter 66 to determine a corona charge density of said corona discharge gun 26.

Figure 2B:
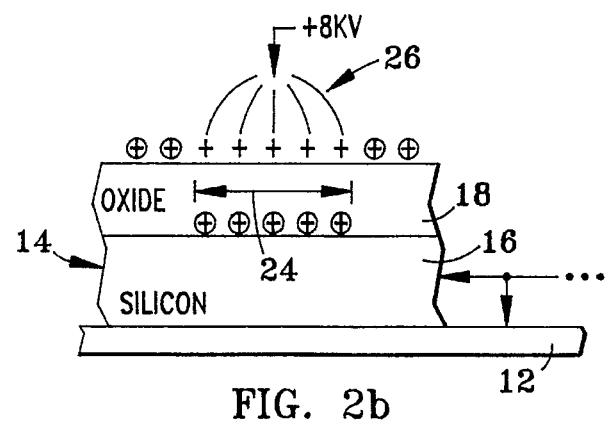
Figure 2C:
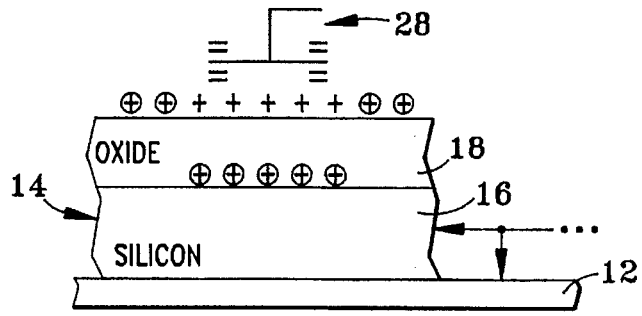
Figure 3:
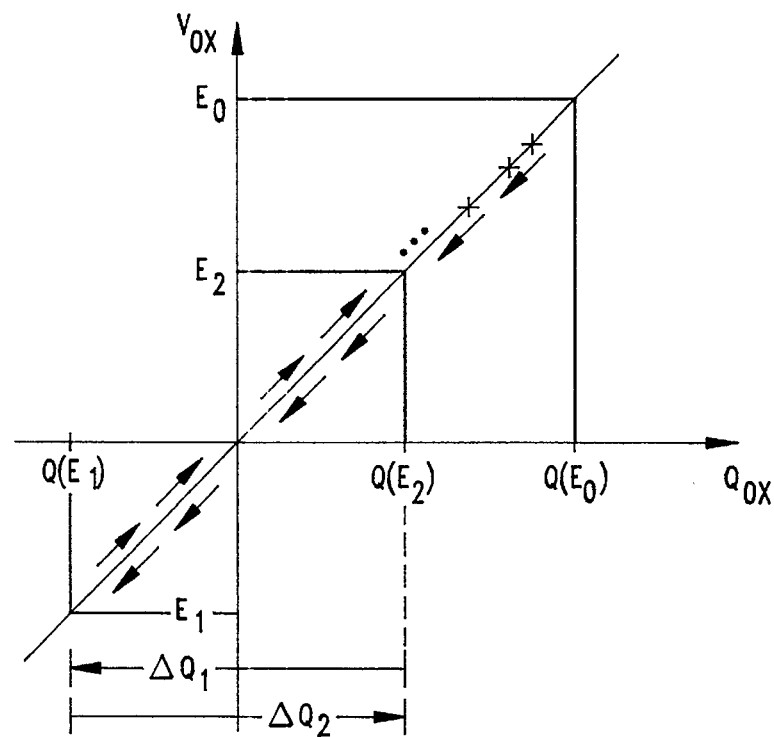
FIG. 3 is a graph showing, on a first order basis and assuming negligible silicon bulk effect, the linear relationship between the surface voltage potential $V_{OX}$ of a dielectric layer and the dielectric field $Q_{OX}$.
Figure 4A:
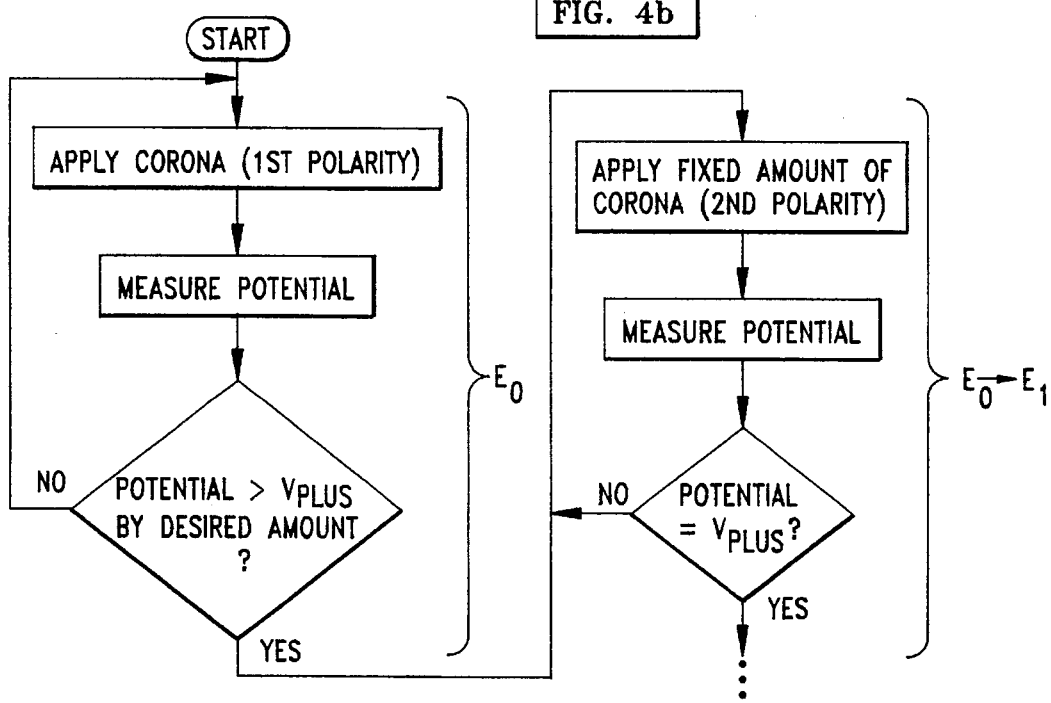
FIG. 4 (a, b) show a flow diagram of the method according to the present invention.
Figure 4B:
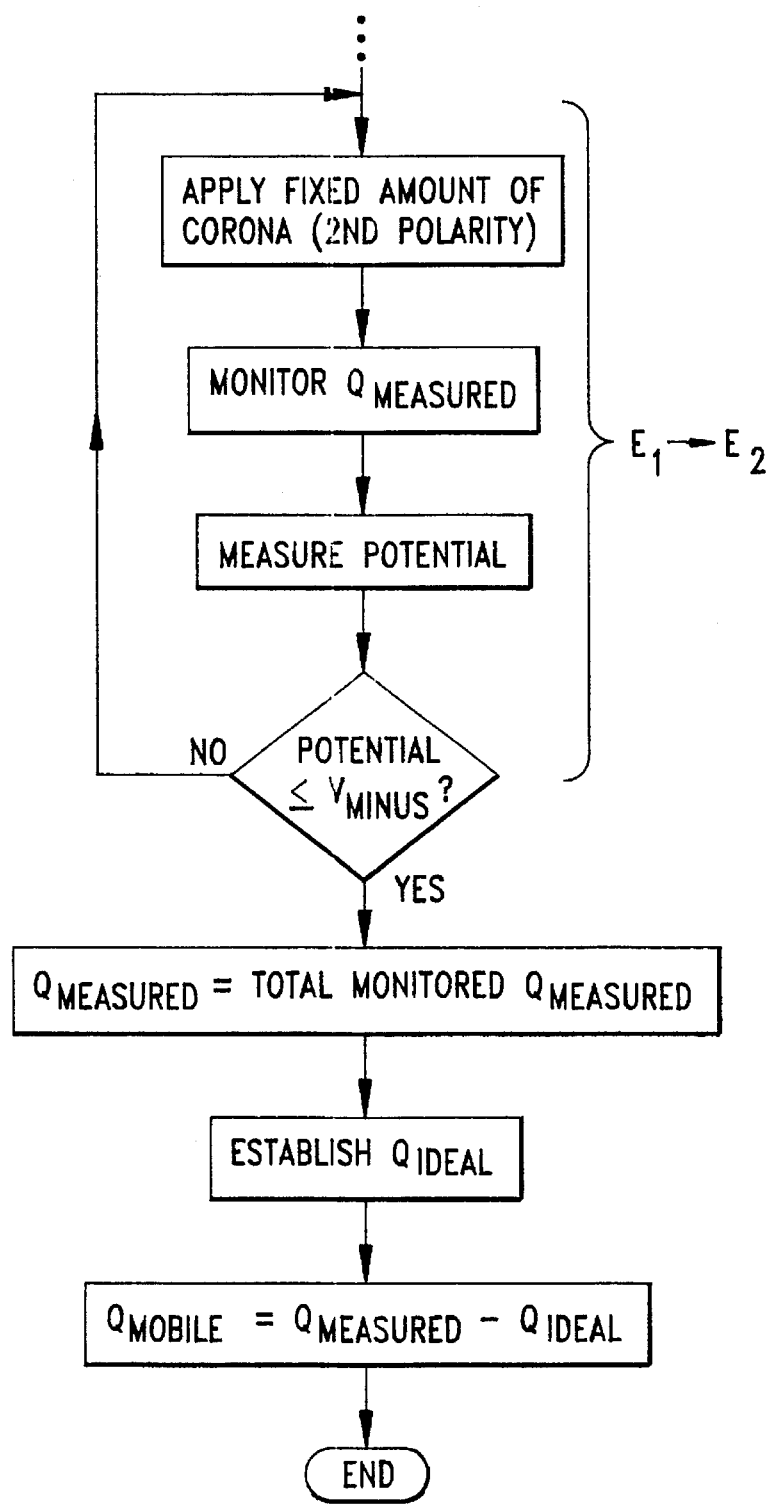

Operation of apparatus 10 will now be explained using an illustrative example in conjunction with FIGS. 2, 3 and 4. FIG. 3 comprises a graph showing, on a first order basis and assuming negligible silicon bulk effect, the linear relationship between the surface voltage potential $V_{OX}$ of the dielectric layer 18 and the dielectric field $Q_{OX}$ across the dielectric. FIG. 4(a) and 4(b) show a flow diagram of the method of the present invention. Thus, to begin, wafer 14 is heated to a temperature in the range of 200°–300° C. for temperature stressing the wafer and for enabling an ion motion (FIG. 2(a)). Mobile ions 70 are illustrated as being present in dielectric layer 18 at the top surface 20. As an aside, mobile ions (e.g., sodium, potassium) in a dielectric layer are to be distinguished from implanted dopant ions (e.g., boron, phosphorous) in silicon. Referring again to FIGS. 2, 3 and 4, upon the obtaining of the desired wafer temperature, corona gun 26 is used to deposit a corona charge of positive polarity upon surface 20 of dielectric layer 18 in the measurement region 24 (FIGS. 2(b) and 4(a)). The corona charge is deposited in a pulsed manner until a positive stress bias corresponding to a positive electric field on the order of plus 1 Mv/cm (i.e., plus 1E6 volts/cm or corresponding to a surface voltage potential greater than $V_{PLUS}$) is attained across the dielectric layer. For a dielectric layer on the order of 1600 Å thick, such a positive electric field of 1 Mv/cm correlates to a surface voltage potential of positive sixteen volts (i.e., plus 16 volts). This corresponds to the initial surface voltage potential $E_0$ in FIG. 3. Establishing this initial dielectric field of 1 Mv/cm causes any mobile ions present in the measurement region 24 to move or drift from the dielectric bulk and the air/dielectric interface 20 to the dielectric/substrate interface 22 (FIG. 2(b)). Surface voltage potential in the measurement region 24 is monitored in between corona discharge pulses using electrostatic measurement means 28 (FIGS. 2(c) and 4(a)). Depositing of the positive pulsed corona charge is stopped when surface voltage potential $E_0$ has been attained. Establishment of the initial dielectric field of 1 Mv/cm takes approximately two minutes.

Figure 2D:
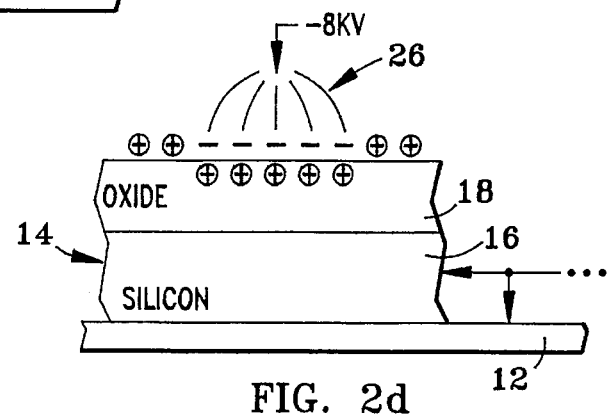
Figure 2E:
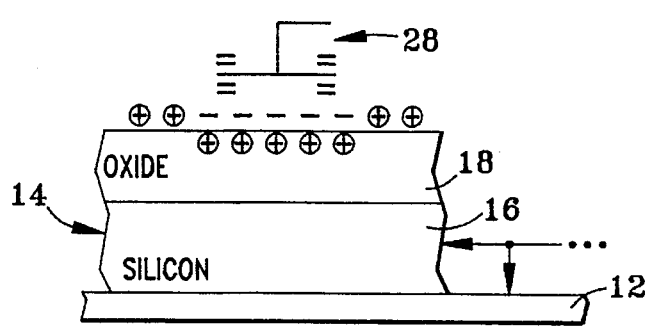

Referring now to FIGS. 2(d) and 4(a), corona gun 26 is used to deposit a corona charge of negative polarity upon surface 20 of dielectric layer 18 in the measurement region 24. The corona charge is initially deposited in a pulsed manner until a positive electric field on the order of plus 0.5 Mv/cm (i.e., plus 0.5E6 volts/cm or corresponding to a surface voltage potential equal to $V_{PLUS}$) is attained across the dielectric layer. For a dielectric layer on the order of 1600 Å thick, such a positive electric field of 0.5 Mv/cm correlates to a surface voltage potential of positive eight volts (i.e., plus 8 volts). This corresponds to a first surface voltage potential $E_1$ (or $V_{PLUS}$) in FIG. 3 (or FIG. 4(a)). At this point, any mobile ions present in the measurement region 24 remain substantially at the dielectric/substrate interface 22 as shown in FIG. 2(b). Surface voltage potential in the measurement region 24 is monitored in between negative corona discharge pulses using electrostatic measurement means 28. Upon the attaining of a surface voltage potential of $E_1$, the amount of charge deposited upon the measurement surface is thereafter monitored, as will be explained further below.

Referring again to FIGS. 2(d) and 4(b), corona gun 26 is used to continue depositing a corona charge of negative polarity upon surface 20 of dielectric layer 18 in the measurement region 24. The corona charge is deposited in a pulsed manner until the electric field across the dielectric is changed from the positive electric field on the order of plus 0.5 Mv/cm to a negative electric field on the order of minus 0.5 Mv/cm (i.e., −0.5E6 volts/cm or corresponding to a surface voltage potential less than or equal to $V_{MINUS}$). For a dielectric layer on the order of 1600 Å thick, such a negative electric field of −0.5 Mv/cm correlates to a surface voltage potential of negative eight volts (i.e., −8 volts). This corresponds to a second surface voltage potential $E_2$ (or $V_{MINUS}$) in FIG. 3 (or FIG. 4(b)). During this transition from the positive electric field on the order of 0.5 Mv/cm to a negative electric field on the order of −0.5 Mv/cm, mobile ions will rapidly de-trap from the dielectric/substrate interface 22 and drift to the dielectric surface 20 as the internal dielectric field changes sign from plus to minus. Upon reaching the second surface voltage potential $E_2$, any mobile ions present in the measurement region 24 have been caused to move from the dielectric/substrate interface 22 to the air/dielectric interface 20 as shown in FIG. 2(d). Surface potential voltage $E_2$ is verified using electrostatic measurement means 28 (FIG. 2(e)).

During the establishing of the second dielectric field across the dielectric layer, corresponding to the surface voltage potential being reduced from $E_1$ to $E_2$ and in which mobile ions in the dielectric layer de-trap and drift from the dielectric/substrate interface to the air/dielectric interface, a portion of the deposited corona charge is cancelled by the mobile ions. This cancellation effect, thus, in turn, requires that some additional amount of negative corona charge be deposited when reducing the surface voltage potential from $E_1$ to the resultant potential $E_2$. Thus the actual amount of $dQ_{OX}$, as required for creating a given value of $dV_{OX}$ (with the presence of mobile ions), will exceed a $Q_{IDEAL}$ (i.e., $dQ_{OX(IDEAL)}$) by an amount exactly equal to the mobile charge $Q_{MOBILE}$ of interest.

The cumulative amount of deposited negative corona charge is monitored during the application of negative corona discharge to determine an amount of corona charge necessary for reducing the surface voltage potential from $E_1$ to $E_2$ (FIG. 4(b)). This cumulative monitored charge corresponds to a measured amount of corona charge $Q_{MEASURED}$ necessary to change a dielectric field of the dielectric layer by a desired amount (delta $Q_1$ in FIG. 3) corresponding to the change in surface voltage potential from $E_1$ to $E_2$ in the presence of any mobile ions. As mentioned earlier, any mobile ions present at the dielectric/substrate interface 22 de-trap and drift to the air/dielectric interface during the change of surface voltage potential from $E_1$ to $E_2$. At the end of the above procedure for changing the surface voltage potential from $E_1$ to $E_2$, a precisely measured change in dielectric surface potential ($dV_{OX}$) will have occurred due to a precisely measured change of corona charge density ($dQ_{OX}$) applied to the dielectric surface 20.

The next step in the operation of apparatus 10 is establishing an ideal charge $Q_{IDEAL}$ corresponding to an amount of charge necessary to change a dielectric field of the dielectric layer, in the absence of any mobile ions, from a third dielectric field corresponding to the second surface voltage potential $E_2$ to a fourth dielectric field corresponding to the first surface voltage potential $E_1$. This is shown in FIG. 3 as delta $Q_2$.

Figure 5:
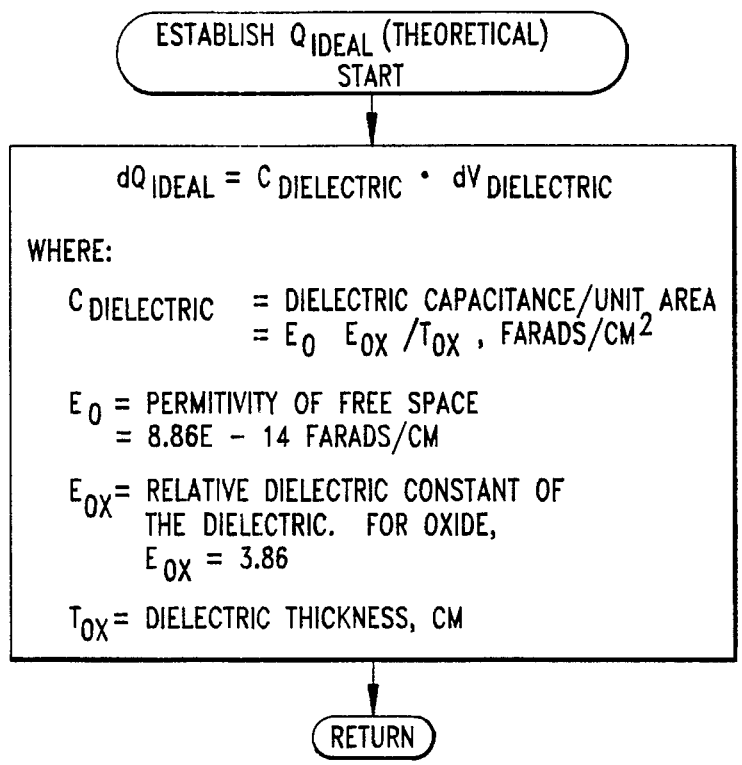
FIG. 5 is a detailed flow diagram of a portion of the flow diagram of FIG. 4 according to one embodiment.

The present invention utilizes one of two approaches for the establishing of an ideal charge $Q_{IDEAL}$ as follows. In a first manner, establishing an ideal charge $Q_{IDEAL}$ comprises theoretically determining $Q_{IDEAL}$ based upon a dielectric constant of the dielectric layer, a thickness of the dielectric layer, and a change in the surface voltage potential corresponding to a desired change in a dielectric field. Such a determination is further in accordance with the expression as shown in FIG. 5, ignoring field induced changes in the underlying silicon surface potential, as well as dielectric leakage.

Figure 6:
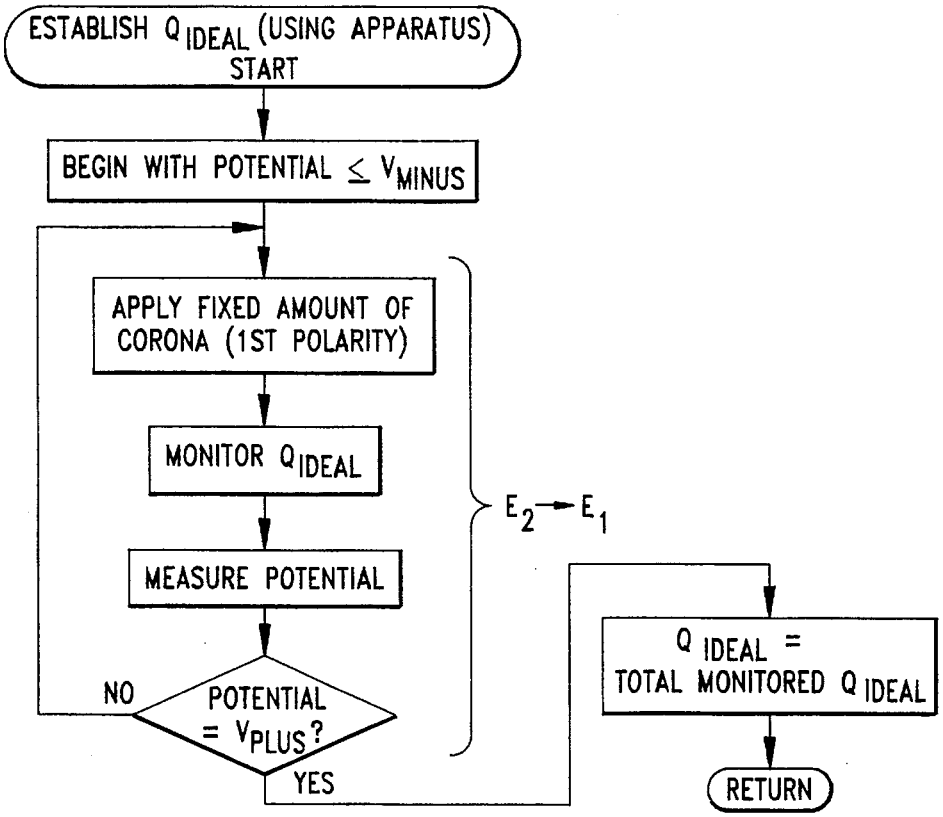
FIG. 6 is a detailed flow diagram of a portion of the flow diagram of FIG. 4 according to an alternate embodiment.

In a second manner, for greater mobile charge accuracy, $Q_{IDEAL}$ is empirically determined using the corona discharge to quickly (on the order of 15 seconds) change the dielectric field back to a value on the order of $E_1$ (i.e., plus 0.5E6 volts/cm). During this time, mobile ions will remain mostly trapped at the air/dielectric surface 20 and the resultant value of $dQ_{OX}$ needed to create a given $dV_{OX}$ will automatically contain the affects of any silicon potential changes and dielectric leakage. Thus, the resultant value of $dQ_{OX}$ can be used as a good practical value for $Q_{IDEAL}$ (i.e., $dQ_{OX(IDEAL)}$). Stated in another way, establishing an ideal charge $Q_{IDEAL}$ comprises increasing the surface voltage potential in the measurement region from $E_2$ to $E_1$ and monitoring a cumulative corona charge deposited on the surface of the dielectric layer during the increase in surface voltage potential from $E_2$ to $E_1$ in the absence of mobile ions, wherein the cumulative monitored charge corresponds to a measured amount of corona charge $Q_{IDEAL}$ and any mobile ions present at the air/dielectric interface are temporarily immobile during measurement of $Q_{IDEAL}$ (See FIG. 6).

The corona discharge from corona gun 26 is suitably calibrated by depositing corona charge upon the calibration electrode and monitoring a current output signal from the current meter for determining a corona charge density of the corona discharge gun. Suitable adjustments in the high voltage power supply may be made for achieving a desired corona density. Calibration of the corona gun further facilitates an ability to optimize a step size of the corona discharge pulses which are applied during the charge deposition steps.

Figure 7:
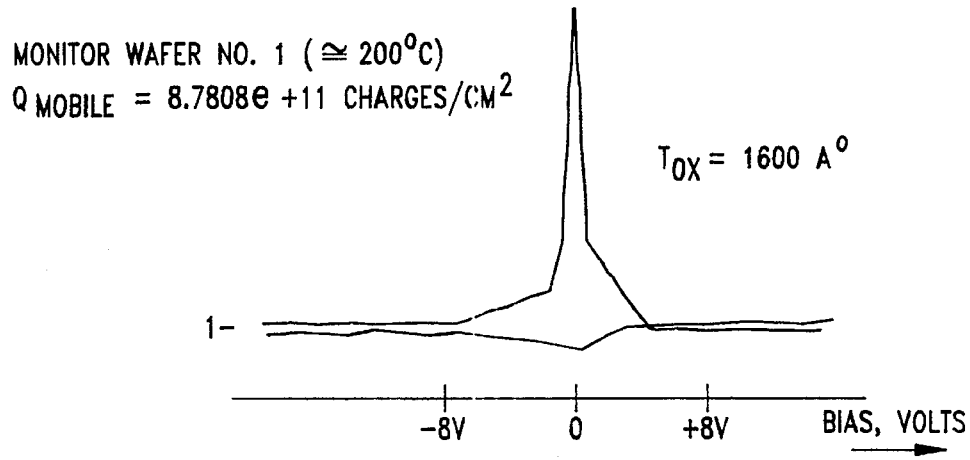
FIG. 7 shows a plot of a ratio of delta $V_{EXPECTED}$ to delta $V_{ACTUAL}$ for a first sample wafer as tested at a temperature for enabling ion motion, according to the method of the present invention, the first sample wafer having a high mobile ion concentration.
Figure 8:
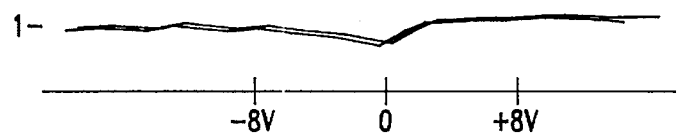
FIG. 8 shows a plot of a ratio of delta $V_{EXPECTED}$ to delta $V_{ACTUAL}$ for a second sample wafer as tested at a temperature for enabling ion motion, according to the method of the present invention, the second sample wafer having a low mobile ion concentration, in comparison with the first sample wafer.

Referring now to FIGS. 7 and 8, two oxidized monitor wafers were tested with the apparatus and method in accordance with the present invention. The oxide thickness of each monitor wafer was on the order of 1600 Angstroms. Each wafer was heated to a temperature on the order of approximately 200 degrees C. The first monitor wafer contained high mobile charge, whereas the second monitor wafer contained low mobile charge. The high charge wafer comprised a sputtered platinum charge monitor wafer. The low charge wafer comprised an epi monitor wafer. As controlled corona discharge increments were used to change the oxide field from plus 0.5E6 volts/cm (i.e., $E_1$) to minus 0.5E6 volts/cm (i.e., $E_2$) and back to plus 0.5E6 volts/cm (i.e., $E_1$), the ratio of each corona increment ($dV_{EXPECTED}$) divided by each resultant incremental change in oxide voltage ($dV_{ACTUAL}$) was plotted as a function of oxide voltage. See FIGS. 7 and 8 for these Q-V plots. A pronounced ionic peak is noted in FIG. 7, due to a rapid motion of a rather high mobile ion concentration in the first wafer as the oxide field changed sign from plus to minus. In contrast, note the lack of a perceptible ionic peak in FIG. 8 for the second wafer, consistent with a much lower mobile ion concentration.

Figure 9:
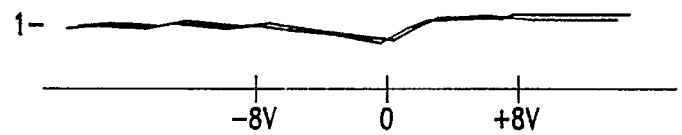
FIG. 9 shows a plot of a ratio of delta $V_{EXPECTED}$ to delta $V_{ACTUAL}$ for the first sample wafer as tested at room temperature.
Figure 10:
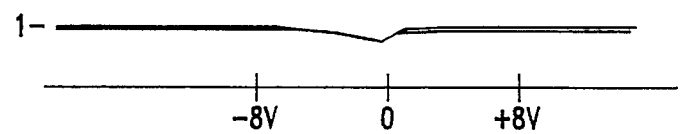
FIG. 10 shows a plot of a ratio of delta $V_{EXPECTED}$ to delta $V_{ACTUAL}$ for the second sample wafer as tested at room temperature.

FIGS. 9 and 10 are representative of the same two wafers of FIGS. 7 and 8, however wherein the above procedure was carried out at approximately 25 degrees C or room temperature. This provided an estimate of the present noise level in the apparatus and technique. At 25° C., ion motion should have been negligible. Thus, any apparent mobile ionic charge would just be the present noise in the system.

Figure 11:
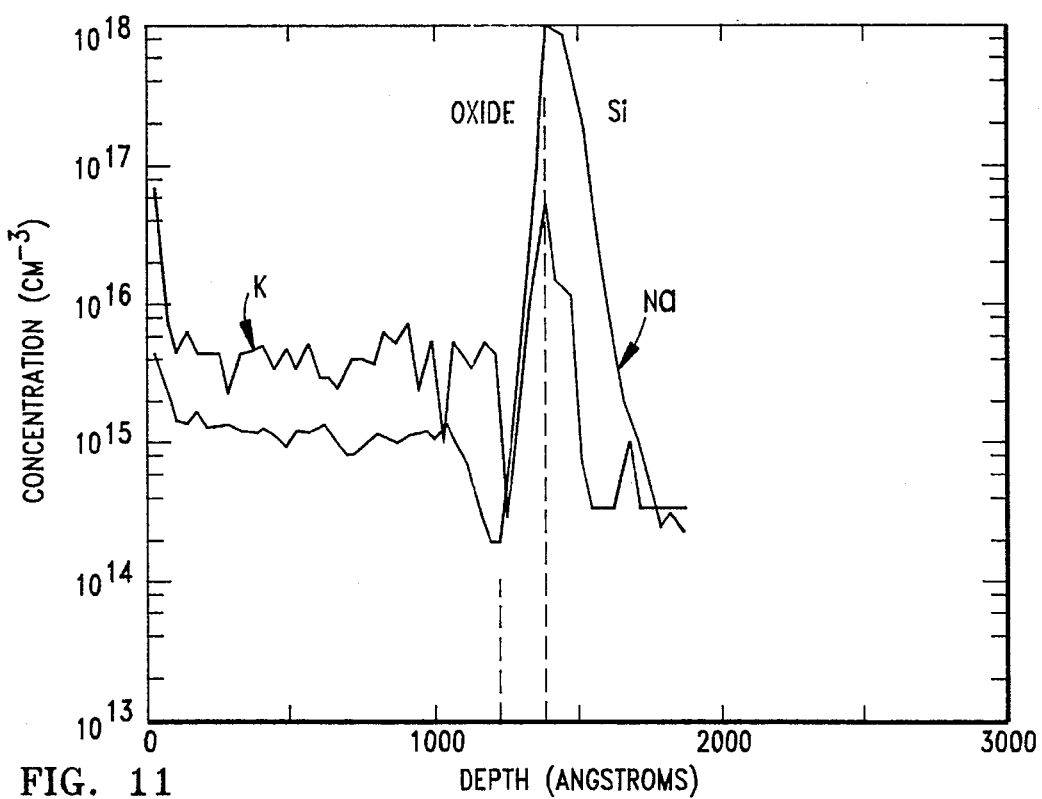
FIG. 11 shows a Secondary Ion Mass Spectroscopy (SIMS) analysis plot for the first sample wafer showing a presence of sodium atoms.
Figure 12:
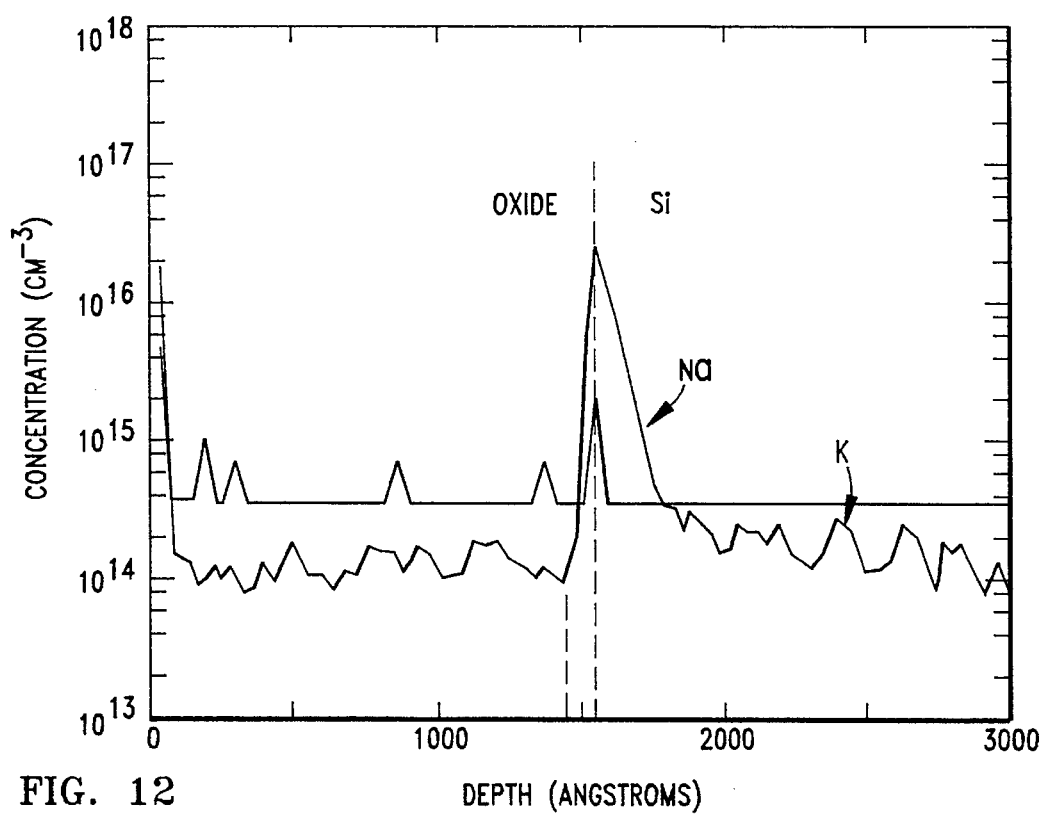
FIG. 12 shows a SIMS analysis plot for the second sample wafer showing a significantly less presence of sodium atoms, one or more orders of magnitude less than that of the first sample wafer.

The monitor wafers tested above were subsequently submitted for a SIMS analysis of sodium and compared to the apparent sodium concentration determined by the method and apparatus of the present invention. An encouraging agreement was found, as shown in FIGS. 11 and 12, corresponding to the first and second monitor wafers, respectively.

There has thus been shown a non-contact method and apparatus for providing corona-oxide-semiconductor mobile ionic charge measurement. Such a method and apparatus advantageously provides non-destructive testing. In addition, with the present method and apparatus, mobile charge is examined in a dielectric layer, wherein the underlying substrate preferably comprises a semiconductor; however, the underlying substrate may also comprise any conductor (such as a metal). The present invention further facilitates a quick testing turn around time, that is, testing in a matter of minutes as compared to several days for conventional MOS techniques. Still further, the method and apparatus of the present invention further provides for an ability to perform such a mobile ionic charge measurement immediately after a dielectric layer is grown or deposited.

While the invention has been particularly shown and described with reference to the preferred embodiment thereof, it will be understood by those skilled in the art that various changes in form and detail may be made therein without departing from the spirit and scope of the invention.

What is claimed is:

1. A contactless corona-oxide-semiconductor mobile ionic charge measurement method for measuring an amount of mobile ionic species in a dielectric layer of a semiconductor wafer, the dielectric layer disposed upon a substrate of the wafer, the wafer further characterized by an air/dielectric interface and a dielectric/substrate interface, said method comprising the steps of:

(a) heating the wafer to a temperature sufficient to temperature stress the wafer and enable an ion motion;

(b) initializing a measurement region of the wafer with a non-contact corona discharge of a first polarity until an initial surface voltage potential $E_0$ is obtained on the dielectric layer, whereby any mobile ions present in the dielectric layer or at the air/dielectric interface are caused to move to the dielectric/substrate interface;

(c) applying a non-contact pulsed corona discharge of a second polarity, opposite from the first polarity, to the wafer at the top surface of the dielectric layer in the measurement region until the surface voltage potential in the measurement region is reduced from $E_0$ to a first surface voltage potential $E_1$;

(d) continuing to apply a non-contact pulsed corona discharge of the second polarity to the wafer at the top surface of the dielectric layer in the measurement region until the surface voltage potential in the measurement region is further reduced from $E_1$ to a second surface voltage potential $E_2$, said step further including monitoring a cumulative amount of corona charge deposited on the surface of the dielectric during the reduction of the surface voltage potential from $E_1$ to $E_2$, wherein the cumulative monitored charge corresponds to a measured amount of corona charge $Q_{MEASURED}$ necessary to change a dielectric field of the dielectric layer by a desired amount corresponding to the change in surface voltage potential from $E_1$ to $E_2$ in the presence of any mobile ions, whereby any mobile ions present at the dielectric/substrate interface are caused to move to the air/dielectric interface;

(e) establishing an ideal amount of charge $Q_{IDEAL}$ corresponding to an amount of charge necessary to change a dielectric field of the dielectric layer, in an absence of any mobile ions, from a third dielectric field corresponding to the second surface voltage potential $E_2$ to a fourth dielectric field corresponding to the first surface voltage potential $E_1$; and (f) comparing the measured amount of corona charge, $Q_{MEASURED}$, to the ideal amount of corona charge, $Q_{IDEAL}$, wherein a quantitative difference between $Q_{MEASURED}$ and $Q_{IDEAL}$ is indicative of an amount of mobile charge $Q_{MOBILE}$, $Q_{MOBILE}$ being representative of the amount mobile ionic species in the dielectric layer.

2. The method of claim 1, wherein establishing an ideal charge $Q_{IDEAL}$ in step (e) comprises theoretically determining $Q_{IDEAL}$ based upon a dielectric constant of the dielectric layer, a thickness of the dielectric layer, and a change in the surface voltage potential corresponding to a desired change in a dielectric field.

3. The method of claim 1, wherein establishing an ideal charge $Q_{IDEAL}$ in step (e) comprises increasing the surface voltage potential in the measurement region from $E_2$ to $E_1$ and monitoring a cumulative corona charge deposited on the surface of the dielectric layer during the increase in surface voltage potential from $E_2$ to $E_1$ in the absence of mobile ions, wherein the cumulative monitored charge corresponds to a measured amount of corona charge $Q_{IDEAL}$ and any mobile ions present at the air/dielectric interface are temporarily immobile during measurement of $Q_{IDEAL}$.

4. The method of claim 1, further comprising the step of:

(h) calibrating the pulsed corona discharge, said calibration step comprising providing a calibration electrode of known dimension connected to a current meter, the current meter further providing an output current signal, whereby a corona discharge is deposited upon the calibration electrode and a current output from the current meter is monitored to determine a corona charge density of the corona discharge.

5. A contactless corona-oxide-semiconductor method for measuring an amount of mobile ionic species in a dielectric layer of a semiconductor wafer, the dielectric layer disposed upon a substrate of the wafer, the wafer characterized by an air/dielectric interface and a dielectric/substrate interface, said method comprising the steps of:

(a) heating and maintaining the wafer at a wafer temperature sufficient to temperature stress the wafer and enable an ion motion;

(b) providing a non-contact corona discharge means for providing a corona discharge upon the surface of the dielectric layer, said corona discharge means comprising a corona gun electrically connected to a controllable high voltage power supply, the corona gun for emitting a corona charge in response to an excitation by the high voltage power supply;

(c) providing a non-contact electrostatic measurement means for measuring a surface voltage potential of the dielectric layer of the wafer, said electrostatic measurement means comprising a vibrator and a voltage potential pick-up plate;

(d) translationally positioning the corona gun of said corona discharge means and the voltage potential pick-up plate of said electrostatic measuring means above the dielectric layer of the wafer and further alternating a positioning of the corona gun and a positioning of the voltage potential pick-up plate above a measurement region of the dielectric layer;

(e) monitoring a corona current ($I_C$) induced in the wafer upon an application of a corona discharge thereon and providing a current signal;

(f) monitoring a corona charge ($Q_C$) deposited on the surface of the dielectric layer upon an application of a corona discharge thereon and providing a charge signal; and (g) controlling the discharge from the corona discharge means in conjunction with controlling the translational positioning of the corona discharge means and electrostatic measurement means, and further in partial response to the current and charge signals, for (i) establishing an initial surface voltage potential $E_0$ in the measurement region, whereby any mobile ions present in the dielectric layer or at the air/dielectric interface are caused to move to the dielectric/substrate interface, (ii) reducing the initial surface voltage potential $E_0$ to establish a first surface voltage potential $E_1$, (iii) continuing to reduce the surface voltage potential, from $E_1$ to a second surface voltage potential $E_2$, and monitoring a cumulative corona charge deposited on the surface of the dielectric layer during the reduction of the surface voltage potential from $E_1$ to $E_2$, wherein the cumulative monitored charge corresponds to a measured amount of corona charge $Q_{MEASURED}$ necessary to change a dielectric field of the dielectric layer by a desired amount corresponding to the change in surface voltage potential from $E_1$ to $E_2$ in the presence of any mobile ions, whereby any mobile ions present at the dielectric/substrate interface are caused to move to the air/dielectric interface, (v) establishing an ideal charge $Q_{IDEAL}$ corresponding to an amount of charge necessary to change a dielectric field of the dielectric layer, in an absence of any mobile ions, from a third dielectric field corresponding to the second surface voltage potential $E_2$ to a fourth dielectric field corresponding to the first surface voltage potential $E_1$, and (vi) providing a mobile charge output signal indicative of an amount of mobile ionic charge $Q_{MOBILE}$ as a function of $Q_{MEASURED}$ and $Q_{IDEAL}$, $Q_{MOBILE}$ further being representative of the amount of ionic species in the dielectric layer.

6. The method of claim 5, wherein, in step (g), in establishing an ideal charge $Q_{IDEAL}$, said step comprises theoretically determining $Q_{IDEAL}$ based upon a dielectric constant of the dielectric layer, a thickness of the dielectric layer, and a change in the surface voltage potential corresponding to a desired change in a dielectric field.

7. The method of claim 5, wherein, in step (g), in establishing an ideal charge $Q_{IDEAL}$, said step comprises increasing the surface voltage potential from $E_2$ to $E_1$ and monitoring a cumulative corona charge deposited on the surface of the dielectric layer during the increase in surface voltage potential from $E_2$ to $E_1$ in the absence of mobile ions, wherein the cumulative monitored charge corresponds to a measured amount of corona charge $Q_{IDEAL}$ and any mobile ions present at the air/dielectric interface are temporarily immobile during measurement of $Q_{IDEAL}$.

8. The method of claim 5, further comprising the step of:

(h) calibrating said corona discharge means, said calibration step comprising providing a calibration electrode of known dimension connected to a current meter, the current meter further providing an output current signal;

said method further wherein, controlling the discharge from the corona discharge means in conjunction with controlling the translational positioning of the corona discharge means to deposit corona upon the calibration electrode and monitoring a current output from the current meter to determine a corona charge density of said corona discharge means.

9. A contactless corona-oxide-semiconductor apparatus for measuring an amount of mobile ionic species in a dielectric layer of a semiconductor wafer, the dielectric layer disposed upon a substrate of the wafer, the wafer characterized by an air/dielectric interface and a dielectric/substrate interface, said apparatus comprising:

(a) wafer chuck means for heating the wafer, said wafer chuck means being controllable for maintaining a wafer temperature sufficient to temperature stress the wafer and enable an ion motion;

(b) non-contact corona discharge means for providing a corona discharge upon the surface of the dielectric layer, said corona discharge means comprising a corona gun electrically connected to a controllable high voltage power supply, the corona gun for emitting a corona charge in response to an excitation by the high voltage power supply;

(c) non-contact electrostatic measurement means for measuring a surface voltage potential of the dielectric layer of the wafer, said electrostatic measurement means comprising a vibrator and a voltage potential pick-up plate;

(d) means for translationally positioning the corona gun of said corona discharge means and the voltage potential pick-up plate of said electrostatic measuring means above the dielectric layer of the wafer and further alternating a positioning of the corona gun and a positioning of the voltage potential pick-up plate above a measurement region of the dielectric layer;

(e) means for monitoring a corona current ($I_C$) induced in the wafer upon an application of a corona discharge thereon and providing a current signal;

(f) means for monitoring a corona charge ($Q_C$) deposited on the surface of the dielectric layer upon an application of a corona discharge thereon and providing a monitored charge signal; and (g) means for controlling said corona discharge means and said translationally positioning means, and in partial response to the current and charge signals, for (i) establishing an initial surface voltage potential $E_0$ in the measurement region, whereby any mobile ions present in the dielectric layer or at the air/dielectric interface are caused to move to the dielectric/substrate interface, (ii) reducing the initial surface voltage potential $E_0$ to establish a first surface voltage potential $E_1$, (iii) continuing to reduce the surface voltage potential, from $E_1$ to a second surface voltage potential $E_2$, and monitoring a cumulative corona charge deposited on the surface of the dielectric layer during the reduction of the surface voltage potential from $E_1$ to $E_2$, wherein the cumulative monitored charge corresponds to a measured amount of corona charge $Q_{MEASURED}$ necessary to change a dielectric field of the dielectric layer by a desired amount corresponding to the change in surface voltage potential from $E_1$ to $E_2$ in the presence of any mobile ions, whereby any mobile ions present at the dielectric/substrate interface are caused to move to the air/dielectric interface, (v) establishing an ideal charge $Q_{IDEAL}$ corresponding to an amount of charge necessary to change a dielectric field of the dielectric layer, in an absence of any mobile ions, from a third dielectric field corresponding to the second surface voltage potential $E_2$ to a fourth dielectric field corresponding to the first surface voltage potential $E_1$, and (vi) providing a mobile charge output signal indicative of an amount of mobile ionic charge $Q_{MOBILE}$ as a function of $Q_{MEASURED}$ and $Q_{IDEAL}$, $Q_{MOBLIE}$ further being representative of the amount of mobile ionic species in the dielectric layer.

10. The apparatus of claim 9, wherein said control means, in establishing an ideal charge $Q_{IDEAL}$, comprises theoretically determining $Q_{IDEAL}$ based upon a dielectric constant of the dielectric layer, a thickness of the dielectric layer, and a change in the surface voltage potential corresponding to a desired change in a dielectric field.

11. The apparatus of claim 9, wherein said control means, in establishing an ideal charge $Q_{IDEAL}$, comprises increasing the surface voltage potential from $E_2$ to $E_1$ and monitoring a cumulative corona charge deposited on the surface of the dielectric layer during the increase in surface voltage potential from $E_2$ to $E_1$ in the absence of mobile ions, wherein the cumulative monitored charge corresponds to a measured amount of corona charge $Q_{IDEAL}$ and any mobile ions present at the air/dielectric interface are temporarily immobile during measurement of $Q_{IDEAL}$.

12. The apparatus of claim 9, further comprising (h) calibration means for calibrating said corona discharge means, said calibration means comprising a calibration electrode of known dimension connected to a current meter, the current meter further providing an output current signal to said control means;

said apparatus further wherein, said control means further for controlling said corona discharge means and said translationally positioning means for depositing corona upon the calibration electrode and monitoring a current output from the current meter to determine a corona charge density of said corona discharge means.

* * * * *